(12) United States Patent
Stavenga et al.

(10) Patent No.: US 8,817,227 B2
(45) Date of Patent: Aug. 26, 2014

(54) IMMERSION LITHOGRAPHY APPARATUS

(75) Inventors: Marco Koert Stavenga, Eindhoven (NL); Hans Jansen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 656 days.

(21) Appl. No.: 12/285,432

(22) Filed: Oct. 3, 2008

(65) Prior Publication Data

US 2009/0115983 A1 May 7, 2009

Related U.S. Application Data

(60) Provisional application No. 60/960,605, filed on Oct. 5, 2007.

(51) Int. Cl.
*G03B 27/52* (2006.01)
*G03B 27/42* (2006.01)
*G03B 27/58* (2006.01)
*G03B 27/32* (2006.01)

(52) U.S. Cl.
USPC .............. 355/30; 355/53; 355/72; 355/77

(58) Field of Classification Search
USPC .......... 355/30, 52, 53, 55, 72, 77; 324/658, 324/660–662, 664, 694; 430/8, 30, 311, 430/320; 250/492.1, 492.2, 492.22, 548
See application file for complete search history.

(56) References Cited

U.S. PATENT DOCUMENTS

| | | | |
|---|---|---|---|
| 4,509,852 A | | 4/1985 | Tabarelli et al. ................ 355/30 |
| 5,241,188 A | * | 8/1993 | Mizutani ...................... 250/548 |
| 6,119,059 A | * | 9/2000 | Tai et al. ...................... 701/31.9 |
| 6,377,060 B1 | * | 4/2002 | Burkhart et al. ......... 324/756.01 |
| 7,075,616 B2 | | 7/2006 | Derksen et al. |
| 7,170,583 B2 | * | 1/2007 | Van Der Meulen et al. .... 355/53 |
| 2004/0136494 A1 | | 7/2004 | Lof et al. ..................... 378/34 |
| 2004/0207824 A1 | | 10/2004 | Lof et al. ..................... 355/30 |
| 2004/0211920 A1 | * | 10/2004 | Maria Derksen et al. . 250/492.1 |
| 2005/0024609 A1 | * | 2/2005 | De Smit et al. ............... 355/18 |

(Continued)

FOREIGN PATENT DOCUMENTS

| | | |
|---|---|---|
| EP | 1 420 298 | 5/2004 |
| EP | 1 420 300 | 5/2004 |

(Continued)

OTHER PUBLICATIONS

English translation of JP 2005-175173, published Jun. 30, 2005.*

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

An immersion lithographic apparatus is disclosed that includes a detector to measure a distance between a substrate support structure and/or a substrate and a fluid handling system and/or to detect when an item is present between the fluid handling system and a top surface of the substrate and/or substrate support structure. The detector may use information of an electrical property of the fluid provided by the fluid handling system to measure the distance. The detector may measure variation in resistance and/or in capacitance between an electrode of the fluid handling system and an electrode of the substrate and/or substrate support structure.

23 Claims, 4 Drawing Sheets

(56) References Cited

U.S. PATENT DOCUMENTS

| | | | |
|---|---|---|---|
| 2005/0037269 A1* | 2/2005 | Levinson | 430/30 |
| 2006/0033898 A1* | 2/2006 | Cadee et al. | 355/53 |
| 2006/0038968 A1 | 2/2006 | Kemper et al. | 355/18 |
| 2006/0082748 A1* | 4/2006 | Schmidt et al. | 355/53 |
| 2006/0114435 A1* | 6/2006 | Hazelton et al. | 355/53 |
| 2006/0126043 A1* | 6/2006 | Mizutani et al. | 355/53 |
| 2006/0158627 A1 | 7/2006 | Kemper et al. | 355/53 |
| 2007/0139632 A1 | 6/2007 | Shiraishi et al. | 355/55 |
| 2007/0296939 A1* | 12/2007 | Nishii | 355/53 |
| 2008/0032234 A1* | 2/2008 | Mizutani | 430/311 |
| 2008/0156356 A1* | 7/2008 | Nagasaka et al. | 134/115 R |
| 2008/0198347 A1* | 8/2008 | Kawasaki et al. | 355/30 |
| 2008/0212046 A1 | 9/2008 | Riepen et al. | |
| 2008/0246493 A1* | 10/2008 | Gardner | 324/662 |
| 2008/0309892 A1* | 12/2008 | Chen et al. | 355/30 |
| 2009/0009739 A1* | 1/2009 | Kosugi | 355/53 |

FOREIGN PATENT DOCUMENTS

| | | |
|---|---|---|
| EP | 1 477 856 | 11/2004 |
| EP | 1 482 372 | 12/2004 |
| EP | 1 628 163 | 2/2006 |
| JP | 2004-289128 | 10/2004 |
| JP | 2005/175173 | 6/2005 |
| JP | 2005-175176 | 6/2005 |
| JP | 2005183744 A * | 7/2005 |
| JP | 2005-308145 | 11/2005 |
| JP | 2006-113246 | 4/2006 |
| JP | 2006-210408 | 8/2006 |
| JP | 2007-241109 | 9/2007 |
| WO | WO 99/49504 | 9/1999 |
| WO | WO 2006030902 A1 * | 3/2006 ................ G03F 7/20 |
| WO | WO 2006/084641 | 8/2006 |

OTHER PUBLICATIONS

English translation of JP 2005-183744, published Jul. 7, 2005.*

Japanese Office Action mailed Mar. 2, 2011 in corresponding Japanese Patent Application No. 2008-258797.

Japanese Office Action mailed Apr. 6, 2012 in corresponding Japanese Patent Application No. 2008-258797.

* cited by examiner

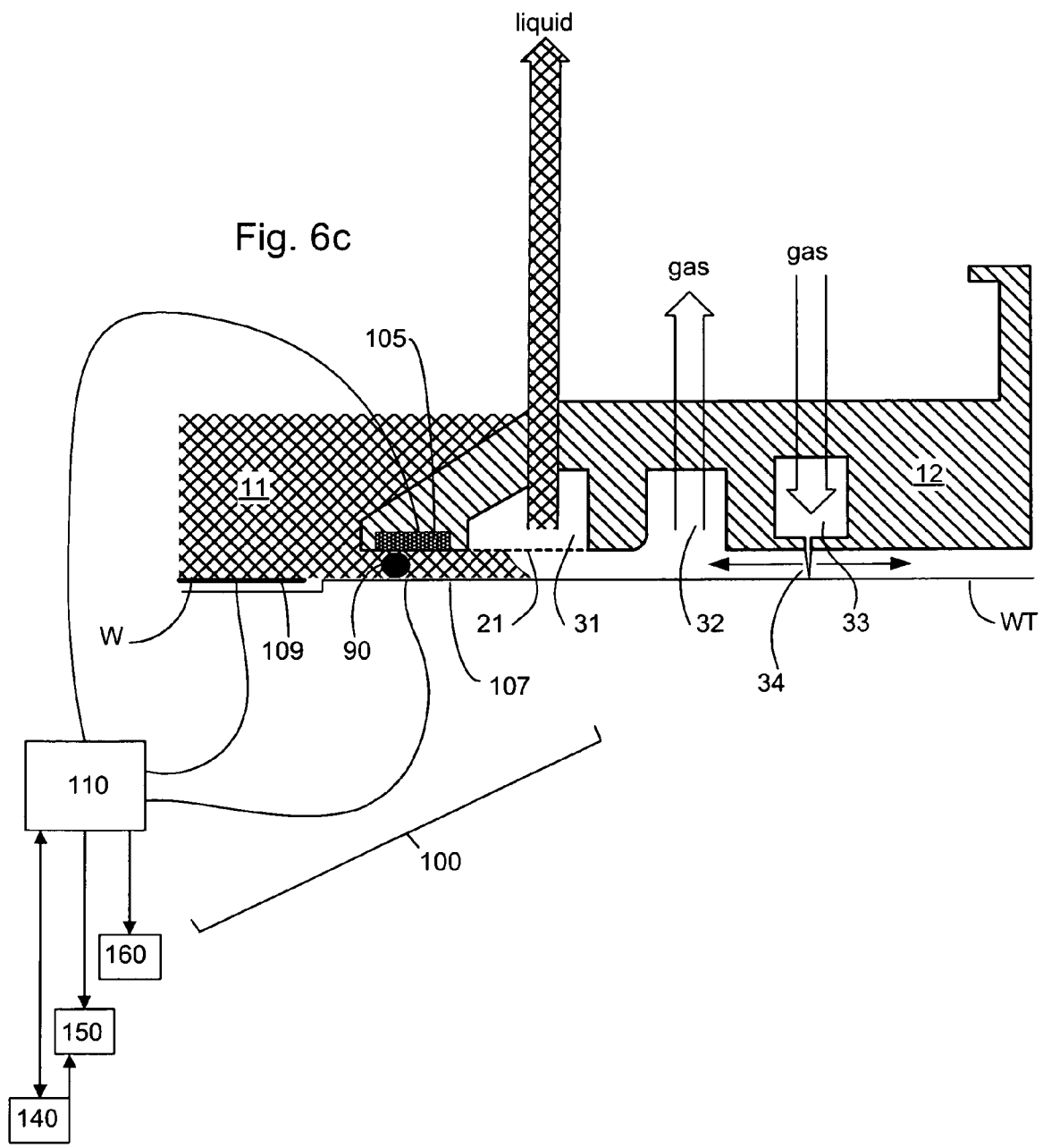

IMMERSION LITHOGRAPHY APPARATUS

CROSS-REFERENCE TO RELATED APPLICATIONS

This application claims priority to and the benefit of U.S. Provisional Application No. 60/960,605, filed Oct. 5, 2007, the entire contents of which is hereby incorporated by reference.

FIELD

The present invention relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although an other liquid could be used. Embodiments of the present invention will be described with reference to liquid. However, a fluid may be suitable, particularly a wetting fluid, an incompressible fluid and/or a fluid with higher refractive index than air, desirably a higher refractive index than water. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate support structure in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Many types of immersion lithography apparatus have in common that immersion fluid is provided to a space between the final element of the projection system and the substrate. That liquid is also usually removed from that space. For example, such removal can be for cleaning of the immersion fluid or for temperature conditioning of the immersion fluid etc.

Damage to a substrate or components of an immersion system such as liquid supply apparatus or a substrate support structure can occur in immersion lithography.

SUMMARY

It is desirable, for example, to detect damage or prevent it from happening in the first place.

According to an aspect of the invention, there is provided an immersion lithographic apparatus comprising: a substrate support structure for holding a substrate; a fluid handling system for handling a fluid between a projection system and the substrate and/or substrate support structure; and a detector for (a) using information of an electrical property of the fluid to measure a distance between the fluid handling system and the substrate and/or substrate support structure, and/or (b) detecting when an item is present between the fluid handling system and a top surface of the substrate and/or substrate support structure.

According to an aspect of the invention, there is provided an immersion lithographic apparatus comprising: a substrate support structure for holding a substrate; a fluid handling system for providing a fluid between a projection system and the substrate and/or substrate support structure; and a detector comprising at least one electrode on the fluid handling system and at least one electrode on the substrate and/or substrate support structure.

According to an aspect of the invention, there is provided an immersion lithographic apparatus comprising: a substrate support structure for holding a substrate; a fluid handling system for providing a fluid between a projection system and the substrate and/or substrate support structure; and a detector for detecting when an item is between the fluid supply system and/or the substrate and/or substrate support structure.

According to an aspect of the invention, there is provided an immersion lithographic apparatus comprising: a substrate support structure for holding a substrate; a fluid handling system for providing a fluid between a projection system and the substrate and/or substrate support structure; and a detector for measuring a distance between the fluid handling system and the substrate and/or substrate support structure and for recording in a memory how the measured distance varies with time and/or relative position, in plan, of the fluid handling system and the substrate and/or substrate support structure.

According to an aspect of the invention, there is provided a lithographic apparatus comprising: a substrate support structure constructed and arranged to hold a substrate; a projection system configured to project a patterned beam of radiation onto the substrate; a liquid supply system constructed and arranged to supply liquid between the projection system and the substrate support structure, wherein the substrate support structure and the liquid supply system each comprise an electrical contact in a region to which liquid is to be supplied, the contacts being in an electrical circuit so that when the region is supplied with liquid the contacts are immersed and the resistance and/or capacitance of the liquid can be measured and the measurement of the resistance and/or capacitance is indicative of the distance between the substrate support structure and the liquid supply system, and further comprising a controller configured to control the distance between the liquid supply system above the substrate support structure by using the measured resistance and/or capacitance to avoid collision between the substrate support structure and the liquid supply system.

According to an aspect of the invention, there is provided an immersion lithographic apparatus comprising: a substrate support structure for holding a substrate; a fluid handling system for providing a fluid between a projection system and the substrate and/or substrate support structure; and a sensor comprising at least one electrode on the fluid handling system and at least one electrode on the substrate and/or substrate support structure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6*a-c* depict a further liquid supply system according to an embodiment of the present invention.

DETAILED DESCRIPTION

Figure 1:
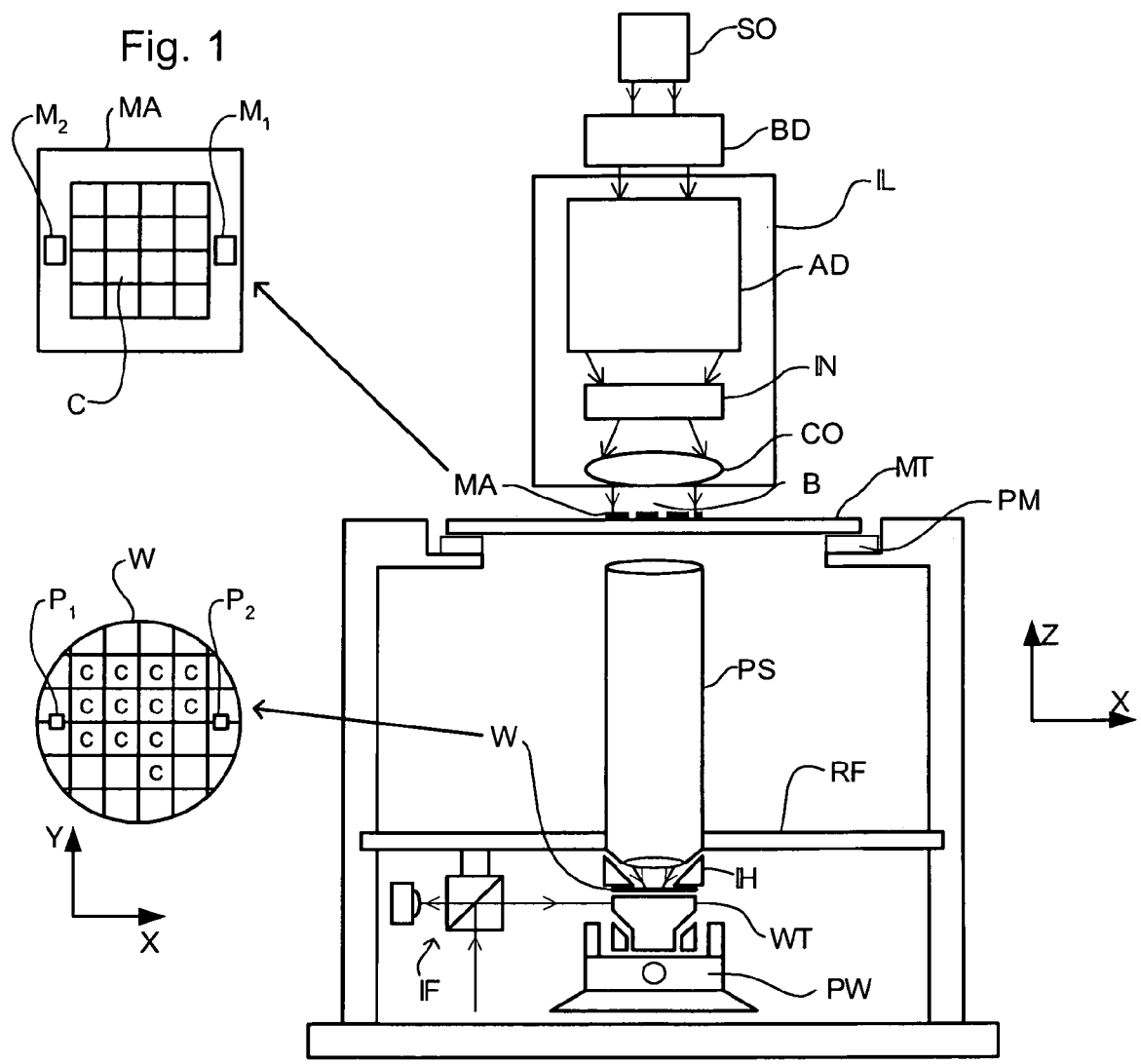
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a patterning device support structure (e.g. a mask table) MT constructed to support a patterning device (e.g. a mask) MA and connected to a first positioner PM configured to accurately position the patterning device in accordance with certain parameters;
- a substrate support structure (e.g. a wafer table or substrate table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate support structures (and/or two or more patterning device support structures). In such "multiple stage" machines the additional support structures may be used in parallel, or preparatory steps may be carried out on one or more support structures while one or more other support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support structure WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support structure WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate support structure WT are kept essentially stationary, while an entire pattern imparted to the radiation beam is projected onto a target portion C at one time (i.e. a single static exposure). The substrate support structure WT is then shifted in the X and/or Y direction so that a different target portion C can be exposed. In step mode, the maximum size of the exposure field limits the size of the target portion C imaged in a single static exposure.

2. In scan mode, the support structure MT and the substrate support structure WT are scanned synchronously while a pattern imparted to the radiation beam is projected onto a target portion C (i.e. a single dynamic exposure). The velocity and direction of the substrate support structure WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate support structure WT is moved or scanned while a pattern imparted to the radiation beam is projected onto a target portion C. In this mode, generally a pulsed radiation source is employed and the programmable patterning device is updated as required after each movement of the substrate support structure WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
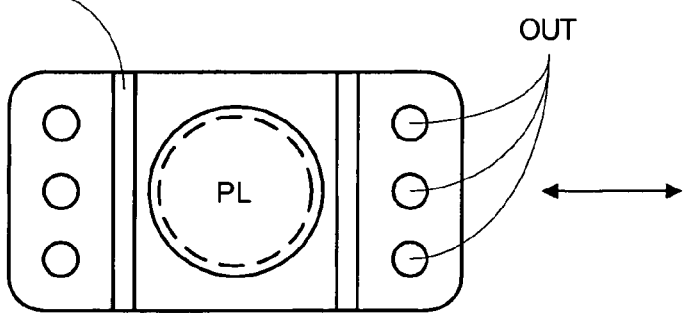
FIG. 4 depicts a further liquid supply system for use in a lithographic projection apparatus.
Figure 4:
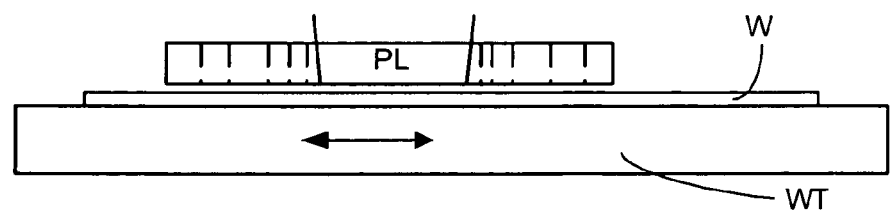

An immersion lithography solution with a localized liquid supply system IH is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the beam of radiation is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
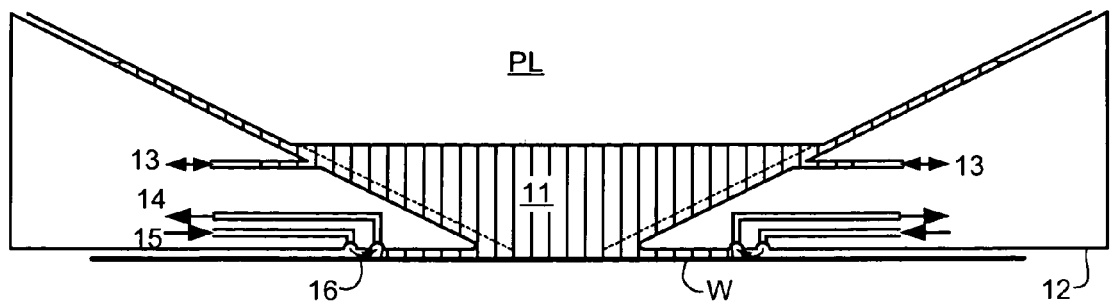
FIG. 5 depicts a liquid supply system.

Another immersion lithography solution with a localized liquid supply system solution which has been proposed is to provide the liquid supply system with a barrier member (or so-called immersion hood IH) which extends along at least a part of a boundary of the space between the final element of the projection system and the substrate support structure. Such a solution is illustrated in FIG. 5. The barrier member is substantially stationary relative to the projection system in the XY plane though there may be some relative movement in the Z direction (in the direction of the optical axis). A seal may be formed between the barrier member and the surface of the substrate. In an embodiment, the seal is a contactless seal such as a gas seal.

Referring to FIG. 5, barrier member 12 forms a contactless seal to the substrate around the image field of the projection system so that liquid is confined to fill an immersion space or reservoir 11 between the substrate surface and the final element of the projection system. The reservoir 11 is at least partly formed by the barrier member 12 positioned below and surrounding the final element of the projection system PL. Liquid is brought into the space below the projection system and within the barrier member 12. For example, liquid may be provided and/or removed through port 13. The barrier member 12 extends a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 formed between the bottom of the barrier member 12 and the surface of the substrate W. The gas seal is formed by gas, e.g. air or synthetic air or $N_2$ or an inert gas, provided under pressure via inlet 15 to the gap between barrier member 12 and substrate. The gas is extracted via first outlet 14. The overpressure on the gas inlet 15, vacuum level on the first outlet 14 and geometry of the gap are arranged so that there is a high-velocity gas flow inwards that confines the liquid. The inlet and/or outlet may be annular grooves which surround the space 11. The groove may be continuous or discontinuous. Such a system is disclosed in United States patent application publication no. US 2004-0207824.

In European patent application publication no. EP 1,420, 300 and United States patent application publication no. US 2004-0136494, each hereby incorporated in their entirety by reference, the idea of a twin or dual stage immersion lithography apparatus is disclosed. Such an apparatus is provided with two support structures for supporting a substrate. Leveling measurements are carried out with a support structure at a first position, without immersion liquid, and exposure is carried out with a support structure at a second position, where immersion liquid is present. Alternatively, the apparatus has only one support structure.

Although an embodiment of the present invention will be described below in relation to a fluid supply system optimized to supply an immersion liquid, an embodiment of the present invention is equally applicable to use of a fluid supply system applying a fluid other than a liquid as the immersion medium. Indeed, the present invention is applicable to any fluid handling system including, but not limited to, the types describes herein.

Figure 6A:
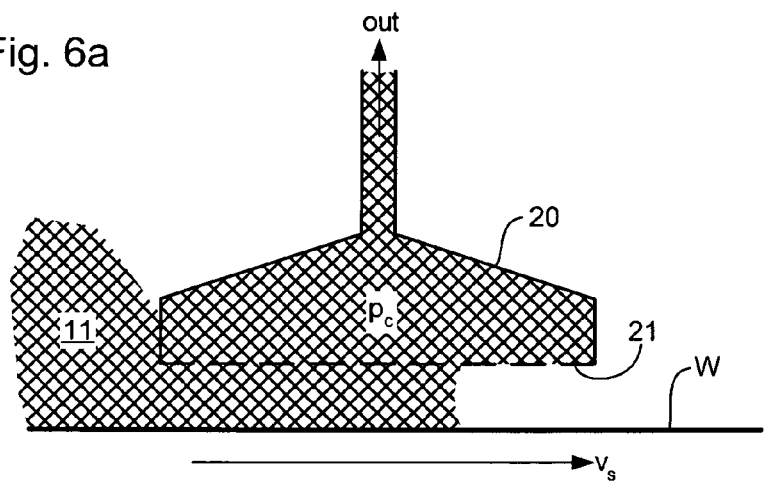
Figure 6B:
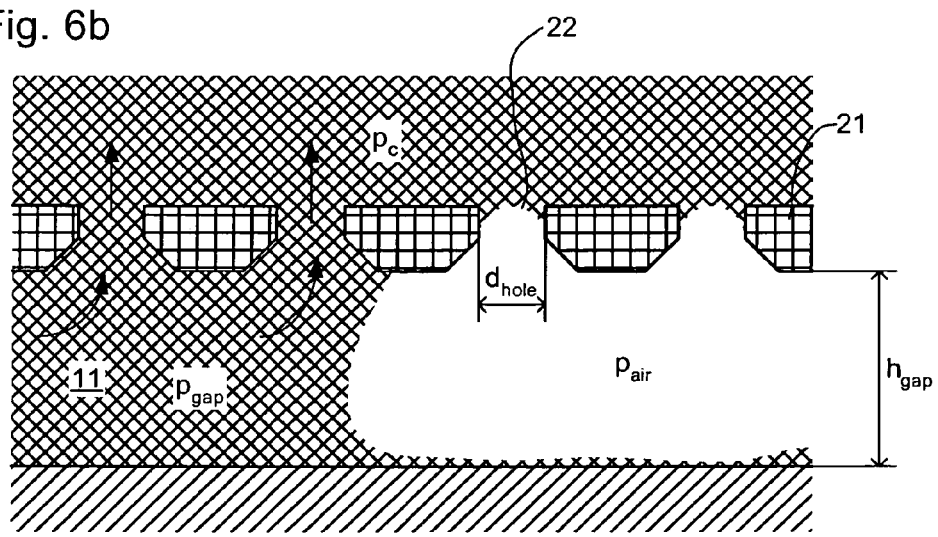

FIGS. 6a and 6b, the latter of which is an enlarged view of part of the former, illustrate a liquid removal device 20 which may be used in an immersion system to remove liquid between the immersion hood IH and the substrate W. The liquid removal device 20 comprises a chamber which is maintained at a slight underpressure $p_c$ and is filled with the immersion liquid. The lower surface of the chamber is formed of a porous member 21 having a large number of small holes, e.g. of diameter $d_{hole}$ in the range of 5 µm to 50 µm. The lower surface is maintained at a gap height $h_{gap}$ of less than 1 mm, desirably in the range of 50 µm to 300 µm above a surface from which liquid is to be removed, e.g. the surface of a substrate W. The porous member 21 may be a perforated plate or any other suitable structure that is configured to allow the liquid to pass therethrough. In an embodiment, porous member 21 is at least slightly liquidphilic (i.e., for water, hydrophilic), i.e. having a contact angle of less than 90° to the immersion liquid, e.g. water.

The underpressure $p_c$ is such that the menisci 22 formed in the holes in the porous member 21 substantially prevent gas being drawn into the chamber of the liquid removal device. However, when the porous member 21 comes into contact with liquid on the surface W there is no meniscus to restrict flow. So the liquid can flow freely into the chamber of the liquid removal device. Such a device can remove most of the liquid from the surface of a substrate W, though a thin film of liquid may remain, as shown in the drawings.

To improve or maximize liquid removal, the porous member 21 should be as thin as possible; and the pressure differential between the pressure in the liquid $p_{gap}$ and the pressure in the chamber $p_c$ should be as high as possible. At the same time, the pressure differential between $p_c$ and the pressure of the gas in the gap $p_{air}$ should be low enough to prevent a significant amount of gas being drawn into the liquid removal device 20. It may not always be possible to prevent gas being drawn into the liquid removal device but the porous member will prevent large uneven flows that may cause vibration. Micro-sieves made by electroforming, photo-etching and/or laser cutting can be used as the porous member 21. Suitable sieves are made by Stork Veco B.V., of Eerbeek, the Netherlands. Other porous plates or solid blocks of porous material may also be used, provided the pore (e.g., hole or perforation) size is suitable to maintain a meniscus with the pressure differential that will be experienced in use.

Such a liquid removal device can be incorporated into many types of barrier member 12 and/or immersion hood IH. One example is illustrated in FIG. 6c as disclosed in United States patent application publication no. US 2006-0038968. FIG. 6c is a cross-sectional view of one side of the barrier member 12, which forms a ring (as used herein, a ring may be circular, rectangular or any other shape and may be continuous or discontinuous) at least partially around the exposure field of the projection system PS (not shown in FIG. 6c). In this embodiment, the liquid removal device 20 is formed by a ring-shaped chamber 31 near the innermost edge of the underside of the barrier member 12. The lower surface of the chamber 31 is formed by a porous member 30 (e.g., perforated plate 21), as described above. Ring-shaped chamber 31 is connected to a suitable pump or pumps to remove liquid from the chamber and maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit in its lower part and is supplied with gas, e.g. air, artificial air or flushing gas, at a pressure such that the gas escaping out of the slit forms a gas knife 34 which is, in an embodiment, downwardly directed. The gas forming the gas knife is extracted by a suitable vacuum pump connected to the gas extraction ring 32 so that the resulting gas flow drives any residual liquid inwardly where it can be removed by the liquid removal device and/or the vacuum pump, which should be able to tolerate vapor of the immersion liquid and/or small liquid droplets. However, since the majority of the liquid is removed by the liquid removal device 20, the small amount of liquid removed via the vacuum system does not cause an unstable flow which may lead to vibration.

Figure 2:
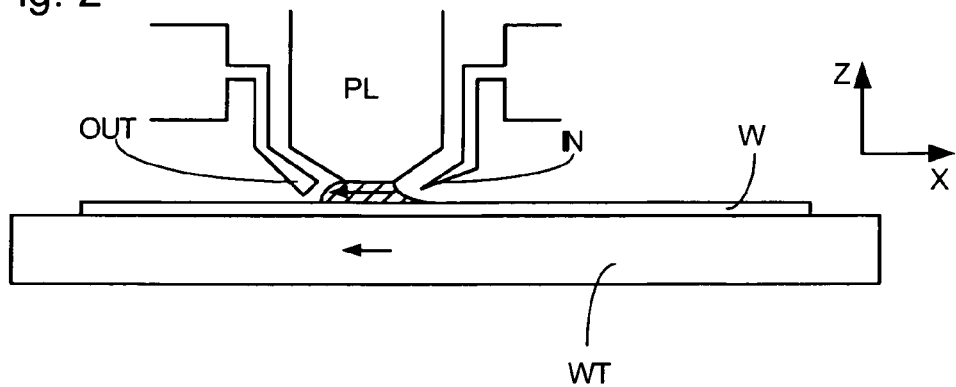
FIGS. 2 and 3 depict a liquid supply system for use in a lithographic projection apparatus.
Figure 3:
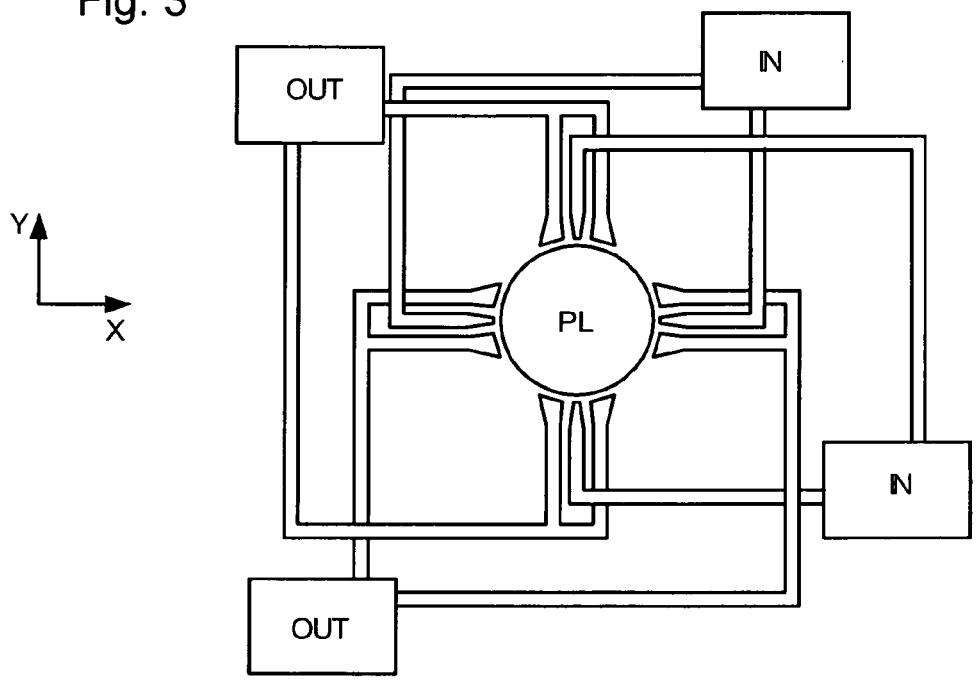

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending continuously or discontinuously, partially along one or more sides of the exposure field, such as for example, shown in FIGS. 2, 3 and 4.

In the apparatus shown in FIG. 6c, most of the gas that forms the gas knife is extracted via gas extraction ring 32, but some gas may flow into the environment around the immersion hood and potentially disturb the interferometric position measuring system IF. This can be prevented by the provision of an additional gas extraction ring outside the gas knife (not illustrated).

Further examples of how such a single phase extractor can be used in an immersion hood or liquid confinement system or liquid supply system can be found, for example in European patent application publication no. EP 1,628,163 and United States patent application publication no. US 2006-0158627. In most applications the porous member will be on an underside of the liquid supply system and the maximum speed at which the substrate W can move under the projection system PS is at least in part determined by the efficiency of removal of liquid through the porous member 21.

A single phase extractor may also be used in a two phase mode in which both liquid and gas are extracted (say 50% gas, 50% liquid). The term single phase extractor is not intended herein to be interpreted only as an extractor which extracts one phase, but more generally as an extractor which incorporates a porous member through which gas and/or liquid is/are extracted.

The above mentioned single phase extractor (as well as other types) can be used in a liquid supply system which supplies liquid to only a localized area of the top surface of the substrate. Furthermore, such a single phase extractor may also be used in other types of immersion apparatus. The extractor may be used for an immersion fluid other than water. The extractor may be used in so-called "leaky seal" liquid supply system. In such a liquid supply system, liquid is provided to the space between the final element of the projection system and the substrate. That liquid is allowed to leak from that space radially outwardly. For example, an immersion hood or liquid confinement system or liquid supply system is used which does not form a seal between itself and the top surface of the substrate or substrate support structure, as the case may be. The immersion fluid may only be retrieved radially outwardly of the substrate in a "leaky seal" apparatus. Liquid or fluid supply or handling systems working on other principles are also included within the scope of an embodiment of the invention. For example such systems include those which use a flow of gas to hold a meniscus of fluid or liquid in place. The flow of gas can be generated by an under pressure being applied to an extractor. The extractor may optionally thereby extract both the fluid or liquid being held in place as well as the gas. That is, there may be two phase extraction. The phases may be extracted in a ratio of about 99:1 gas to fluid or liquid. A porous member such as described above may, or may not be present. The extractor can be in the form of a plurality of downwardly facing needles. The needles may be placed in a diamond like shape. The longest dimension of the diamond may correspond to the direction of scan movements. Such a system is described in U.S. patent application Ser. No. 11/635,079, filed Dec. 7, 2006.

The substrate W may be removed from the substrate support structure WT between exposures of different substrates. When this occurs it may be desirable for liquid to be kept within the liquid confinement system 12. This may be achieved by moving the liquid confinement system 12 relative to the substrate support structure WT, or vice versa, so that the liquid confinement system is placed over a surface of the substrate support structure WT away from the substrate W. Such a surface is a shutter member. Immersion liquid may be retained in the liquid confinement system by operating the gas seal 16 or by clamping the surface of the shutter member to the undersurface of the liquid confinement system 12. The clamping may be achieved by controlling the flow and/or pressure of fluid provided to the undersurface of the liquid confinement system 12. For example, the pressure of gas supplied from the inlet 15 and/or the under pressure exerted from the first outlet 14 may be controlled.

The shutter member may be an integral part of the substrate support structure 12 or it may be a detachable and/or replaceable component of the substrate support structure 12. Such a detachable component may be referred to as closing disk (e.g., a dummy substrate). In a dual or multi stage arrangement the entire substrate support structure 12 is replaced during substrate exchange. In such an arrangement the detachable component may be transferred between substrate support structures. The shutter member may be an intermediate table that may be moved adjacent to the substrate support structure WT, for example, prior to substrate exchange. The liquid confinement system may then be moved onto the intermediate table, or vice versa, during, for example, substrate exchange. The shutter member may be a moveable component of the substrate support structure, such as a retractable bridge, which may be positioned between the substrate support structures during substrate exchange. The surface of the shutter member may be moved under the barrier member, or vice versa, during substrate exchange.

An embodiment of the present invention will be described in relation to the liquid supply system and in particular the barrier member 12 illustrated in FIG. 6c. However, it will be apparent that an embodiment of the present invention may be applied to any sort of fluid or liquid handling system such as a fluid removal system or a fluid supply system. In particular, an embodiment of the present invention is applicable to any fluid or liquid handling system which is not fixed in position relative to the substrate support structure WT.

In use, the substrate support structure WT supports the substrate W. Additionally the substrate support structure WT may comprise various other components. Such components include (but are not limited to) one or more sensors, one or more seals and one or more shutter members. Typically such components are supported or mounted on the top surface of the substrate support structure WT and as such form the top surface of the substrate support structure WT.

The gap between the bottom surface of the barrier member 12 and the top surface of the substrate W or substrate support structure WT is generally kept at a distance of below 1 mm. In the specific example of the FIG. 6 liquid supply system, the gap is, in an embodiment, kept to within the range of 100 μm to 500 μm, or about 100 μm to 200 μm. However, due to changes in force applied to the barrier member 12 or a change in the height of the substrate W, for example, the size of the gap might vary. If the size of the gap becomes zero then the barrier member 12 may collide with the substrate W or substrate support structure WT. Such a collision may cause damage to the substrate support structure WT and/or the substrate W and/or the barrier member 12. Such a collision could cause the generation of particles which could contaminate the immersion liquid. That could lead to imaging defects or further damage.

It is possible for particles 90 to get trapped between the barrier member 12 and the substrate W and/or substrate support structure WT. Particles can include flakes originating from the organic process layers present at the substrate, such as, e.g. resist and topcoat. Such particles 90 may be in contact with the barrier member 12 and/or the substrate support structure WT and/or substrate W (including components mounted or supported on the substrate support structure). Such a particle 90 is illustrated in FIG. 6c. The presence of such a particle 90 can result in damage (perhaps in the form of a scratch) to the top surface of the substrate W, the top surface of the substrate support structure WT, the top surface of any seal or sensor mounted on the top of the substrate support structure WT or the bottom surface of the barrier member 12. Any such damage is undesirable because it may affect the performance of the apparatus as well as cause further debris to be generated. Furthermore, any debris in the immersion liquid may result in a loss of imaging performance.

An embodiment of the present invention is designed to alleviate the above problem and/or other problems. In an embodiment, there is provided a lithographic apparatus comprising: a substrate support structure constructed and arranged to hold a substrate; a projection system configured to project a patterned beam of radiation onto the substrate; a liquid supply system constructed and arranged to supply liquid between the projection system and the substrate support structure, wherein the substrate support structure and the liquid supply system each comprise an electrical contact in the region to which liquid is to be supplied, the contacts being in an electrical circuit so that when the region is supplied with liquid the contacts are immersed and the resistance and/or capacitance of the liquid can be measured and the measurement of the resistance and/or capacitance is indicative of the distance between the substrate support structure and the liquid supply system; and a controller configured to control the distance between the liquid supply system above the substrate support structure by using the measured resistance and/or capacitance to avoid collision between the substrate support structure and the liquid supply system.

In an embodiment, there is provided a detector 100 configured to measure the distance between the barrier member 12 (which can also be described as a fluid handling system/fluid supply or removal system) and the substrate W and/or substrate support structure WT.

In an embodiment, there is provided a detector 100 configured to detect when an item is between and in contact with the barrier member 12 and/or the substrate W and/or the substrate support structure WT.

The detector 100 may comprise at least one sensor, such as an electrode 105 on the barrier member 12, for example in a surface facing the substrate W and/or substrate support structure WT. The detector 100 further comprises at least one sensor, such as an electrode 107, 109 on or in the substrate W and/or substrate support structure WT. The detector may comprise a processor 110 in electronic communication with the electrodes 105, 107, 109. The processor 110 may use the electric signals from the electrodes 105, 107, 109 to determine the measurement measured by the detector 100.

The parameter and/or calculated results measured by the detector 100 can be stored in a memory 150. The memory 150 may be a part of the lithographic apparatus and/or removable therefrom. Thus should the detector 100 detect that a potentially damaging action has occurred, it is possible to find the position at which the damage occurred afterwards by inspecting the memory 150.

The detector 100 may be connected to a signal generator 160. The output of the detector 100 may be used by a signal generator 160 to generate a signal. The signal is indicative of the occurrence of a potentially damaging situation. This signal may bring the occurrence to the attention, e.g. of a user or a controller of the apparatus.

Further, the detector may be connected to a controller 140. The output of the detector 100 may be sent to a controller 140. In response to the output, the controller may control the relative position of the barrier member 12 and substrate support structure WT with respect to each other.

A specific type of detector 100 is illustrated in FIG. 6c. The associated processor (e.g., electronics) 110, controller 140, memory 150 and signal generator 160 may be used in or with any other type of detector as well. Other types of detector include, but are not limited to a pneumatic sensor, an optical (such as a level sensor or interferometer) sensor, an electrical sensor, a magnetic sensor, a combination of the foregoing, or any other sensor. Furthermore a combination of other detectors may be provided. For example, the position of the substrate support structure WT and the position of the barrier member 12 may be measured relative to a known fixed point, e.g. the reference frame RF. From those two measurements it is possible to work out the relative position of the substrate support structure WT and the barrier member 12, which is measured directly by the detector 100 of FIG. 6c. Furthermore, the height of the barrier member 12 above the substrate W can be calculated from information of the position of the substrate support structure WT, a leveling map of the substrate W made during a measurement step, and the height of the barrier member 12 relative to a projection system PS, a metrology reference frame RF or a base frame.

The detector 100 of the FIG. 6c embodiment can do at least one of the following: (a) measure the distance between the bottom surface of the barrier member 12 and the top surface of the substrate support structure WT and/or substrate W; and (b) detect a particle 90 or item or a collision between the barrier member 12 and one or more of the following (or an item mounted thereon): substrate support structure WT and/or substrate W. The detector 100 performs at least one of these functions by detecting a change in electrical resistance between the barrier member 12 and the substrate support structure WT and/or substrate W. Alternatively or additionally the detector 100 detects at least (a) or (b) above by measuring a change in capacitance between the barrier member 12 and the substrate support structure WT and/or substrate W.

An electrical property of the immersion liquid can vary depending upon, for example, composition, temperature, etc. It is not necessary to know the precise properties of the immersion liquid; a change in the measured resistance and/or capacitance are most relevant. However, some information of the properties of the immersion liquid may help in interpreting the measurements. These properties can either be measured directly in the apparatus, or can be stored in a database. It may be advantageous to dissolve a quantity of carbon dioxide in ultra pure water for use as the immersion liquid (see PCT patent application publication no. WO 2006/084641 and United States patent application publication no. US 2007/0139632, for example). One reason for doing this might be to deliberately change an electrical property of the immersion fluid. For example, the electrical resistance of the immersion liquid changes with the amount of dissolved carbon dioxide. Therefore, the database could include information regarding the change in electrical resistance with change in amount of dissolved carbon dioxide.

As illustrated in FIG. 6c, the detector 100 comprises at least two electrodes. At least one electrode is positioned on the barrier member 12. At least one of the electrodes is positioned on the substrate support structure WT (that is, on the body of the substrate support structure WT and/or on one of the components of the substrate support structure) and/or substrate W. In other words, the electrode(s) can be positioned on any part of the apparatus which may come into contact with immersion liquid. There may be further electrodes positioned on the barrier member 12 and/or substrate support structure WT and/or substrate W. The presence of more than one electrode on each of those items allows more information to be generated about the possible location of damage, when detected and/or gives a two dimensional map of the shape of the gap. For example, a plurality of electrodes 105 may be positioned around the periphery (e.g., circumference) of the barrier member 12. In that way, if detector 100 indicates that for only one of those electrodes a collision event has been detected, that information may be useful when it comes to establishing why the collision has occurred and/or repairing any damage caused by the collision. It may also be useful to determine the relative tilt of the barrier member 12 relative to the substrate support structure WT and/or substrate W. A single electrode 105 covering the whole or part of the bottom surface of the barrier member 12 is possible. In the case of the barrier member 12, a body of the barrier member 12 may comprise an electrically conductive material. For example, the body of the barrier member 12 may be made of stainless steel. As stainless steel is electrically conductive no special measures need to be taken in order to form the at least one electrode on the barrier member 12. However, even in the case of the body of the barrier member 12 being made of an electrically conductive material, it may still be possible to provide a plurality of electrodes on it. However, in that case the electrodes 105 would need to be electrically insulated from the body of the barrier member 12.

Usually neither the substrate W nor the top surface of the substrate support structure WT are electrically conductive. In this case, it may be possible to coat at least part of the area of the top surface of the substrate W and/or substrate support structure WT with an electrically conductive coating. A suitable coating could include nickel or chromium or an alloy thereof. Chromium is particularly desirable because it forms a passive layer (through oxidation) that protects the metal against corrosion. A non-metal coating may also be appropriate. For example, both silicon carbide and titanium nitride are electrically conductive. Therefore the electrode or electrodes formed on the substrate W and/or substrate support structure WT may be made of one or more of those materials.

When the detector 100 operates on the basis of a change in resistance detected between at least one electrode 105 formed on the barrier member 12 and at least one electrode 107, 109 formed on the substrate support structure WT and/or substrate W, an electrical circuit is made between the electrodes via processor 110. The physical gap between the electrode 105 on the fluid supply system and the electrode 107, 109 on the substrate support structure WT and/or substrate W is filled with fluid 11 from the fluid supply system 12. In the case that electrode 105, which is not the body of the barrier member 12, is positioned on the barrier member, this electrode should be positioned at a position at which fluid is expected to be, in use. For example, the electrode 105 should be positioned radially inwardly of any fluid removal device 21.

Although it is illustrated in FIG. 6c that electrode 105 is connected to the electrode 107, 109 in a circuit other than through the immersion fluid, this need not necessarily be the case. For example, the electrode 107, 109 or electrode 105 could be connected to ground.

The processor 110 measures the electrical resistance between the electrode 105 and the electrode 107, 109 formed on the substrate support structure WT and/or substrate W. From information of the resistivity of the immersion fluid 11, information regarding the distance between the electrode 105 and electrode 107, 109 can be calculated. If the distance and therefore measured resistance turns to zero and electrode 105 touches electrode 107, 109, a collision event can be assumed to have occurred. If a particle or item 90 comes between or into contact between the electrode 105 and electrode 107, 109 (at normal or subnormal "flight" height of the barrier member 12 relative to the substrate support structure WT and/or substrate W), the measured resistance between electrode 105 and electrode 107, 109 will change. If that particle is made of a conductive material and comes into contact with electrode 105 and electrode 107, 109 the resistance will be zero and a potential collision event can be logged. If the particle 90 is not electrically conductive, it will have an effect on the resistance measurement (because of a change in area over which current is conducted). If the immersion liquid is ultra pure water, the presence of a particle is likely to lead to a reduction in the measured resistance. This technique may also be used to detect items which are above the main surface of the substrate support structure. Such an item may or may not be attached to the substrate support structure. One example might be part of a seal (for instance around a sensor on the substrate support structure) which has parted from the substrate support structure. If such a seal protrudes, the measured resistance and/or capacitance may change. Thus, the situation can be brought, for example, to an operator's attention before more of the seal breaks off so further damage may be avoided.

Alternatively or additionally the processor 110 can calculate the capacitance between the electrode 105 and the electrode 107, 109. Similarly to the embodiment which measures change in resistance, change in capacitance can also be indicative of the above described events.

In an embodiment, data regarding the distance between the electrode 105 and the electrode 107, 109, can be used by a controller 140. The controller 140 is configured to adjust the position of the barrier member 12 and/or substrate support structure WT and/or substrate W. The controller 140 is at least responsible for movement in the direction of the optical axis. The information from processor 110 can be used to avoid collision between the barrier member 12 and the substrate W and/or substrate support structure WT or to maintain the separation between the barrier member 12 and the substrate support structure WT and/or substrate W in a certain range. The certain range is selected based on experience, empirical data or theory. The range may be selected or chosen by user choice. The range may be determined by selected conditions and/or parameters of operation. The range may be determined by in-line measurements of other specified parameters. Such a determined range may be selected prior to operation, i.e. it is predetermined. One or more actuator (not illustrated) may be provided for this purpose in order to move the barrier member 12 and/or the substrate support structure WT in the direction of the optical axis. The controller 140 may be part of the apparatus which controls the X/Y position of the substrate support structure WT.

The result of the processor 110 can also be passed to a memory 150. The memory can record the raw data and/or the processed results from the detector 100. For example, the memory 150 could record the distance between the fluid supply system and the substrate support structure WT and/or substrate W varying with time. Alternatively or additionally, the memory 150 may store the X/Y position of the substrate support structure WT (for example from the controller 140). In this way the data could be used to establish at what relative position of the substrate W and/or substrate support structure WT to the barrier member 12 any collision or other event occurred. The memory 150 may be configured only to store data when a collision event is detected or a potentially damaging particle between the fluid system 12 and the substrate support structure WT or substrate W is detected.

The processor 110 may be connected to a signal generator 160. The signal generator 160 can generate a signal indicative that a collision (or other) event or potentially damaging particle has been detected. Such a signal can bring to attention this fact. The signal can bring the attention of this fact to, for example, a controller (which might take emergency measures to avoid further damage) or to the attention of a user who could decide how best to proceed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and where the immersion liquid is only on a localized surface area of the substrate, or is unconfined. In an unconfined arrangement, the immersion liquid may flow over the surface of the substrate and/or substrate support structure so that substantially the entire uncovered surface of the substrate support structure and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate support structure. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate support structure, or a surface of the space may completely cover a surface of the substrate and/or substrate support structure, or the space may envelop the substrate and/or substrate support structure. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a substrate support structure configured to hold a substrate;
a fluid handling system configured to handle a fluid between a projection system and the substrate and/or substrate support structure; and
a detector configured to use information of an electrical property of the fluid to detect when a substantially solid item is present between the fluid handling system and a top surface of the substrate and/or substrate support structure, wherein the detector comprises at least two electrodes and the fluid handling system comprises one of the at least two electrodes at a position in which, in use, the electrode is in contact with the fluid from the fluid handling system.

2. The immersion lithographic apparatus of claim 1, wherein a surface of the fluid handling system facing the substrate and/or substrate support structure is made from a conductive material.

3. The immersion lithographic apparatus of claim 1, wherein a surface of the substrate and/or substrate support structure facing the fluid handling system comprises a second one of the at least two electrodes.

4. The immersion lithographic apparatus of claim 3, wherein the second one of the at least two electrodes comprises a coating on the substrate and/or substrate support structure.

5. The immersion lithographic apparatus of claim 4, wherein the coating comprises a coating of a material selected from the list: nickel, an alloy of nickel, chromium, an alloy of chromium, silicon carbide, titanium nitride.

6. The immersion lithographic apparatus of claim 1, wherein the detector is configured to measure resistance and/or capacitance between at least two electrodes in order to do the measuring and/or detecting.

7. The immersion lithographic apparatus of claim 1, wherein the detector is configured to measure a distance between the fluid handling system and the substrate and/or substrate support structure, the immersion lithographic apparatus further comprising a controller configured to at least partly use the distance measured by the detector to control the relative position of the fluid handling system and the substrate support structure.

8. The immersion lithographic apparatus of claim 1, wherein the detector is configured to measure a distance between the fluid handling system and the substrate and/or substrate support structure, the immersion lithographic apparatus configured to record in a memory how the distance measured by the detector varies with time and/or relative position, in plan, of the fluid handling system and the substrate support structure and/or substrate.

9. The immersion lithographic apparatus of claim 1, further comprising a signal generator configured to generate a signal when the detector has detected that (a) an item between the fluid handling system and the substrate and/or substrate support structure has come into contact with both the fluid handling system and the substrate and/or substrate support structure and/or (b) the fluid handling system and the substrate and/or substrate support structure have come into contact.

10. The immersion lithographic apparatus of claim 1, wherein the detector is configured to detect when an item between the fluid handling system and the substrate and/or substrate support structure comes into contact with both the fluid handling system and the substrate and/or substrate support structure.

11. The immersion lithographic apparatus of claim 1, wherein the substrate support structure comprises at least one component selected from the list: shutter member, sensor, seal.

12. The immersion lithographic apparatus of claim 11, wherein the detector comprises at least one electrode which is formed on the at least one component.

13. An immersion lithographic apparatus comprising:
a substrate support structure configured to hold a substrate;
a fluid handling system configured to provide a fluid between a projection system and the substrate and/or substrate support structure; and
a detector comprising at least one electrode on the fluid handling system and at least one electrode on the substrate and/or substrate support structure, the detector configured to measure resistance between the at least one electrode on the fluid handling system and the at least one electrode on the substrate and/or substrate support structure.

14. The immersion lithographic apparatus of claim 13, wherein the detector is configured to measure a distance between the fluid handling system and the substrate and/or substrate support structure.

15. The immersion lithographic apparatus of claim 13, wherein the detector is configured to measure capacitance between the at least one electrode on the fluid handling system and the at least one electrode on the substrate and/or substrate support structure.

16. The immersion lithographic apparatus of claim 13, wherein the fluid handling system has a body made of an electrically conductive material, the body forming the at least one electrode on the fluid handling system.

17. The immersion lithographic apparatus of claim 13, wherein the at least one electrode on the substrate and/or substrate support structure is a coating on the substrate and/or substrate support structure.

18. The immersion lithographic apparatus of claim 17, wherein the coating comprises a coating of a material selected from the list: nickel, an alloy of nickel, chromium, an alloy of chromium, silicon carbide, titanium nitride.

19. An immersion lithographic apparatus comprising:
a substrate support structure configured to hold a substrate;
a fluid handling system configured to provide a fluid between a projection system and the substrate and/or substrate support structure; and
a detector configured to detect when an item is between the fluid handling system and the substrate and/or substrate support structure, the detector configured to detect when the item is in direct contact, at the same time, with the fluid handling system and the substrate and/or substrate support structure.

20. The immersion lithographic apparatus of claim 19, configured to record in a memory at which relative position of the fluid handling system and the substrate support structure and/or substrate or at what time, the detector detects an item between and in contact with the fluid handling system and the substrate and/or substrate support structure.

21. The immersion lithographic apparatus of claim 19, wherein the detector is configured to detect an item by a change in resistance and/or capacitance of fluid provided by the fluid handling system between the fluid handling system and the substrate and/or substrate support structure.

22. A device manufacturing method for an immersion lithographic apparatus, the method comprising:
holding a substrate an a substrate support structure;
handling a fluid between a projection system and the substrate and/or the substrate support structure, using a fluid handling system; and
using information of an electrical property of the fluid to detect when a substantially solid item is present between the fluid handling system and a top surface of the substrate and/or the substrate support structure by using a detector with at least two electrodes, the fluid handling system comprising one of the at least two electrodes at a position in which, in use, the electrode is in contact with the fluid from the fluid handling system.

23. A method for an immersion lithographic apparatus, the method comprising:
holding a substrate on a substrate support structure;
handling a fluid between a projection system and the substrate and/or the substrate support structure, using a fluid handling system; and
using a detector to detect when an item is present between the fluid handling system and a top surface of the substrate and/or the substrate support structure and to detect when the item is in direct contact, at the same time, with the fluid handling system and the substrate and/or substrate support structure.

* * * * *